US010134695B2

(12) United States Patent
Lee et al.

(10) Patent No.: US 10,134,695 B2
(45) Date of Patent: Nov. 20, 2018

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Doo Hwan Lee, Suwon-si (KR); Ju Hyeon Kim, Suwon-si (KR); Hyoung Joon Kim, Suwon-si (KR); Joon Sung Kim, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/459,322

(22) Filed: Mar. 15, 2017

(65) Prior Publication Data

US 2018/0082962 A1 Mar. 22, 2018

(30) Foreign Application Priority Data

Sep. 19, 2016 (KR) .......................... 10-2016-0119438

(51) Int. Cl.
*H01L 23/00* (2006.01)
*H01L 23/31* (2006.01)
*H01L 23/498* (2006.01)

(52) U.S. Cl.
CPC .......... *H01L 24/02* (2013.01); *H01L 23/3171* (2013.01); *H01L 23/49816* (2013.01);
(Continued)

(58) Field of Classification Search
CPC ........................... H01L 24/02; H01L 23/3171
(Continued)

(56) References Cited

U.S. PATENT DOCUMENTS 9,324,687 B1 * 4/2016 Kelkar .................... H01L 25/50
9,728,498 B2 * 8/2017 Su .......................... H01L 25/105
(Continued)

FOREIGN PATENT DOCUMENTS

JP 2012-039090 A 2/2012
KR 10-2013-0132163 A 12/2013

OTHER PUBLICATIONS

Office Action issued in corresponding Korean Patent Application No. 10-2016-0119438, dated Jul. 31, 2018.

*Primary Examiner* — Jami V Miller
(74) *Attorney, Agent, or Firm* — McDermott Will & Emery LLP

(57) ABSTRACT

A fan-out semiconductor package includes: a first interconnection member having a through-hole; a semiconductor chip disposed in the through-hole and having an active surface having connection pads disposed thereon and an inactive surface; an encapsulant encapsulating at least portions of the first interconnection member and the inactive surface of the semiconductor chip; and a second interconnection member disposed on the first interconnection member and the active surface of the semiconductor chip. The first interconnection member and the second interconnection member include, respectively, redistribution layers electrically connected to the connection pads of the semiconductor chip, and the encapsulant fills spaces between walls of the through-hole and side surfaces of the semiconductor chip, and at least portions of the encapsulant extend to a space between the first interconnection member and the second interconnection member and a space between the active surface of the semiconductor chip and the second interconnection member.

16 Claims, 10 Drawing Sheets

(52) U.S. Cl.
CPC .. *H01L 23/49827* (2013.01); *H01L 23/49838* (2013.01); *H01L 2224/02331* (2013.01); *H01L 2224/02371* (2013.01); *H01L 2224/02372* (2013.01); *H01L 2224/02373* (2013.01); *H01L 2224/02379* (2013.01)

(58) Field of Classification Search
USPC ........................................................ 257/737
See application file for complete search history.

(56) References Cited

U.S. PATENT DOCUMENTS

| | | | |
|---|---|---|---|
| 9,824,988 B1 * | 11/2017 | Lee | .................... H01L 23/49827 |
| 9,853,003 B1 * | 12/2017 | Han | ...................... H01L 23/645 |
| 2004/0087043 A1 * | 5/2004 | Lee | ...................... B81C 1/00269 |
| | | | 438/6 |
| 2012/0013021 A1 | 1/2012 | Kobayashi et al. | |
| 2015/0123272 A1 * | 5/2015 | Wu | ......................... H01L 24/81 |
| | | | 257/737 |
| 2017/0373035 A1 * | 12/2017 | Seol | ........................ H01L 24/25 |

\* cited by examiner

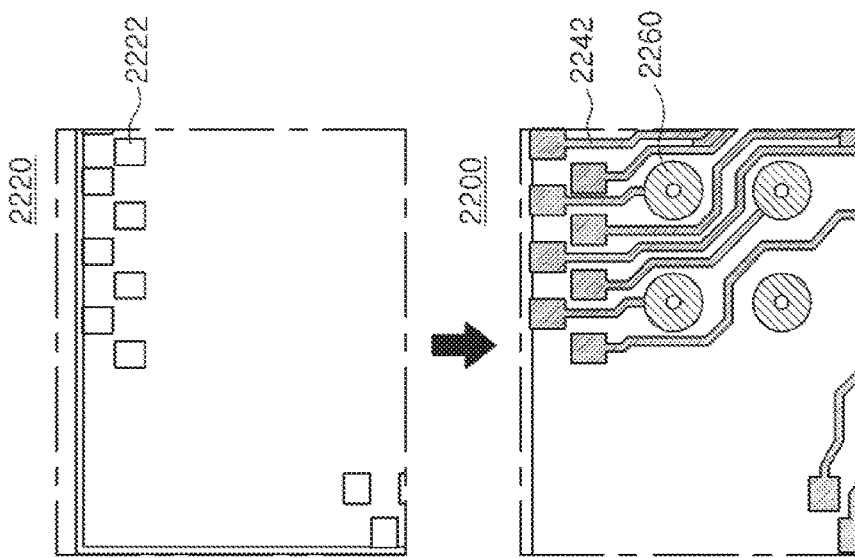
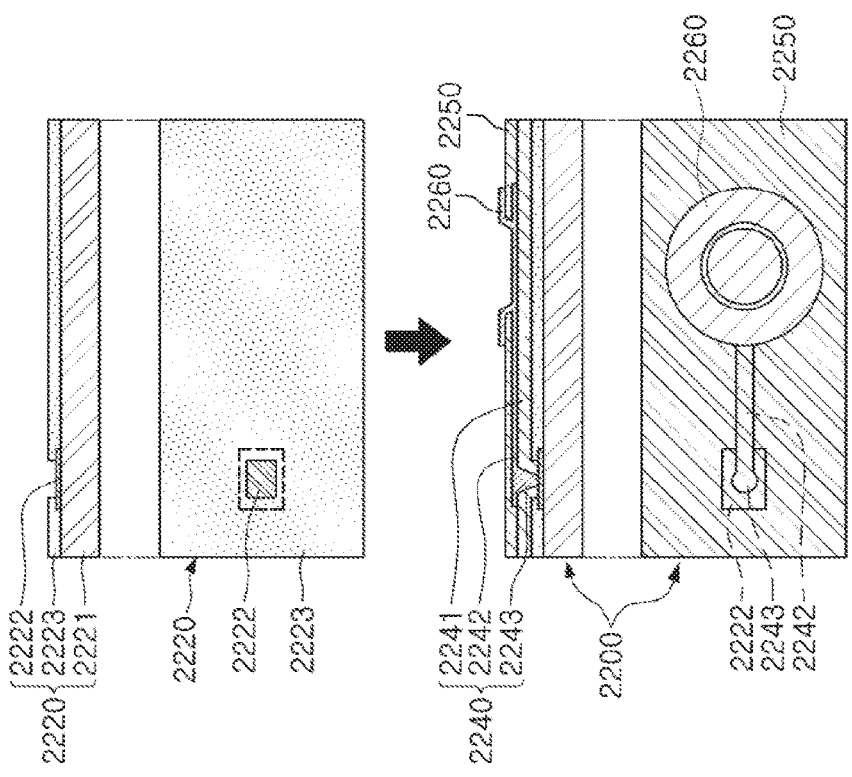
FIG. 3B
FIG. 3A

FAN-OUT SEMICONDUCTOR PACKAGE

CROSS-REFERENCE TO RELATED APPLICATION(S)

This application claims benefit of priority to Korean Patent Application No. 10-2016-0119438 filed on Sep. 19, 2016 in the Korean Intellectual Property Office, the disclosure of which is incorporated herein by reference in its entirety.

TECHNICAL FIELD

The present disclosure relates to a semiconductor package, and more particularly, to a fan-out semiconductor package in which connection terminals may extend outwardly of a region in which a semiconductor chip is disposed.

BACKGROUND

A significant recent trend in the development of technology related to semiconductor chips has been to reduce the size of semiconductor chips. Therefore, in the case of package technology, in accordance with a rapid increase in demand for small-sized semiconductor chips, or the like, the implementation of a semiconductor package having a compact size while including a plurality of pins has been demanded.

One type of package technology suggested to satisfy the technical demand described above is a fan-out package. Such a fan-out package has a compact size and may allow a plurality of pins to be implemented by redistributing connection terminals outwardly of a region in which a semiconductor chip is disposed.

SUMMARY

An aspect of the present disclosure may provide a fan-out semiconductor package of which structural stability is improved.

According to an aspect of the present disclosure, a fan-out semiconductor package of which structural stability is improved by forming an encapsulant in a special form may be provided.

According to an aspect of the present disclosure, a fan-out semiconductor package may include: a first interconnection member having a through-hole; a semiconductor chip disposed in the through-hole of the first interconnection member and having an active surface having connection pads disposed thereon and an inactive surface opposing the active surface; an encapsulant encapsulating at least portions of the first interconnection member and the inactive surface of the semiconductor chip; and a second interconnection member disposed on the first interconnection member and the active surface of the semiconductor chip. The first interconnection member and the second interconnection member include, respectively, redistribution layers electrically connected to the connection pads of the semiconductor chip, and the encapsulant fills spaces between walls of the through-hole and side surfaces of the semiconductor chip, and at least portions of the encapsulant extend to a space between the first interconnection member and the second interconnection member and a space between the active surface of the semiconductor chip and the second interconnection member.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or omitted for clarity.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
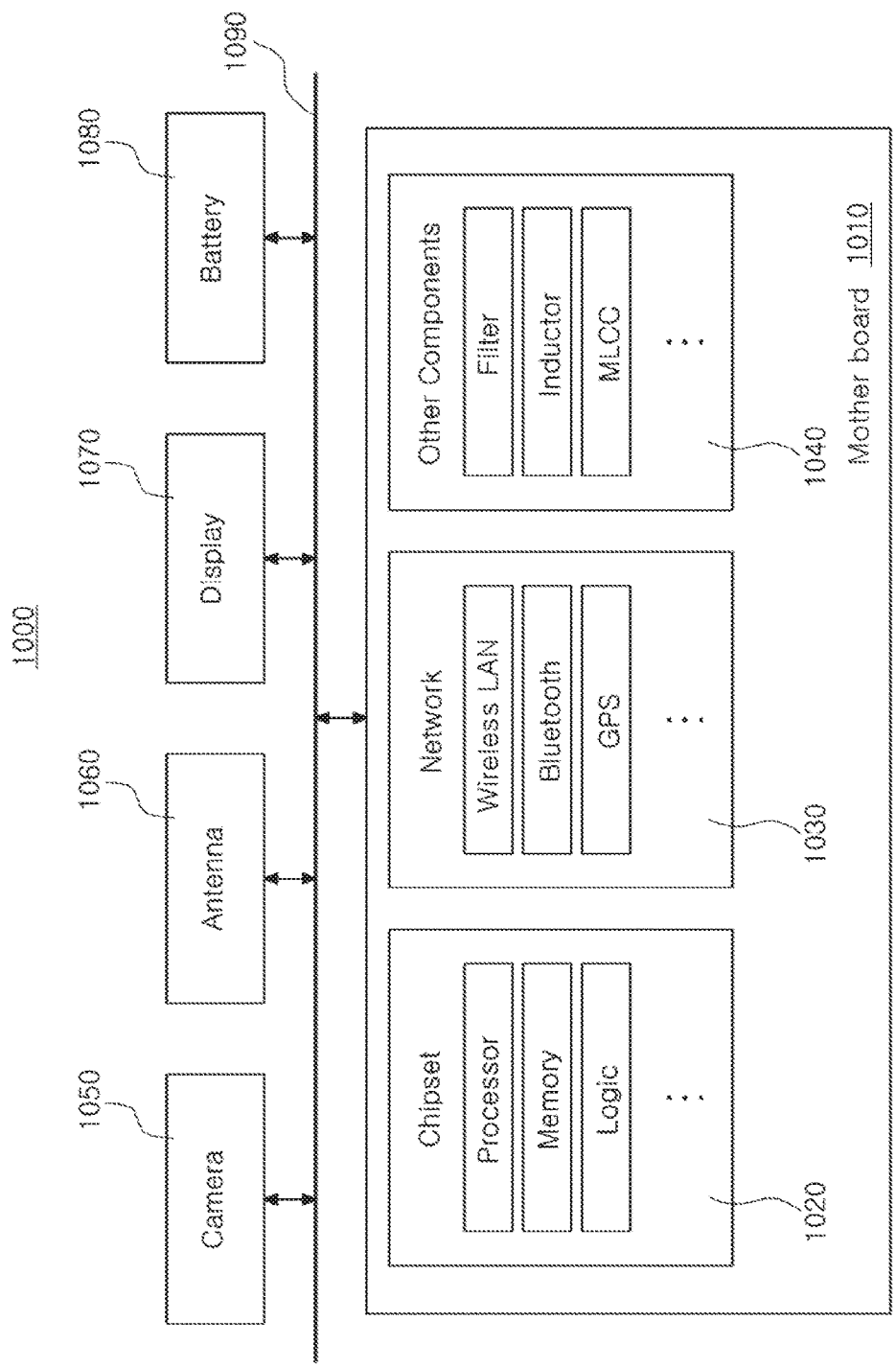
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mother board 1010 therein. The mother board 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, and may also include other types of chip-related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the mother board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
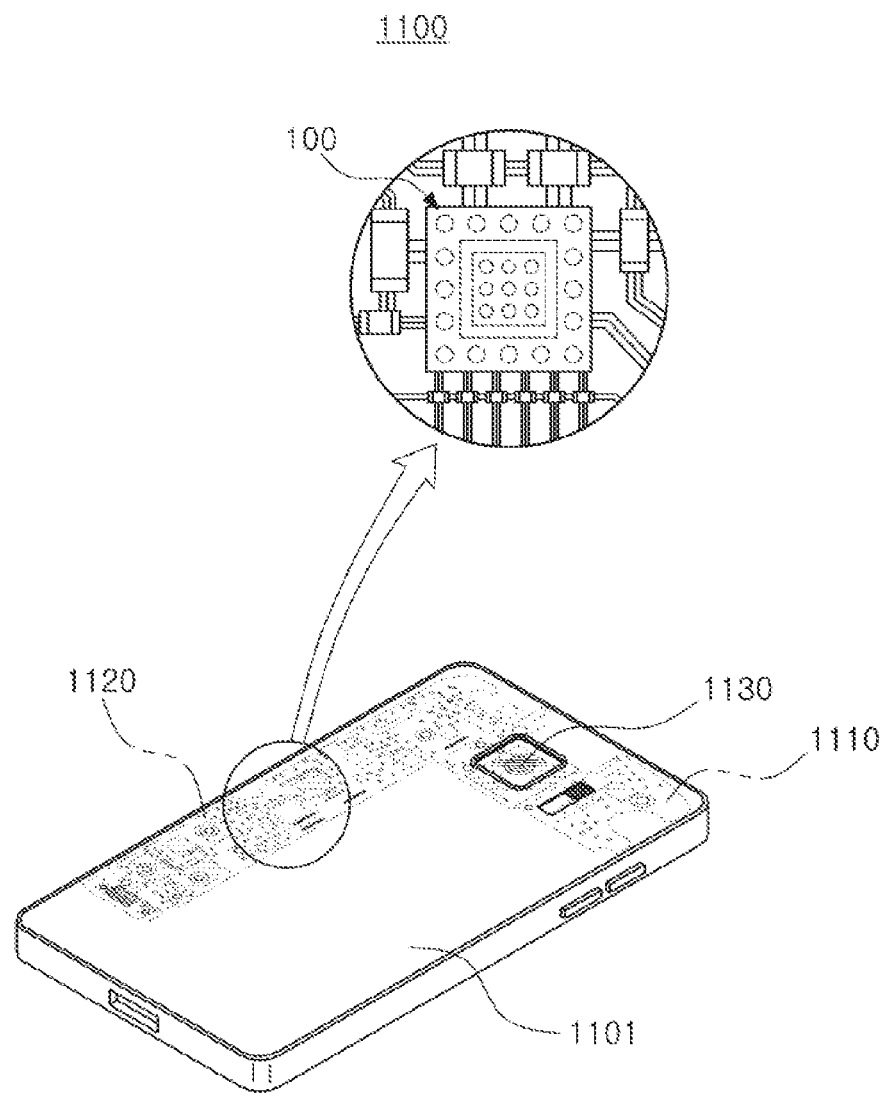
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip-related components, and the semiconductor package 100 may be, for example, an application processor among the chip-related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in circuit widths between the semiconductor chip and a main board of the electronic device in terms of electrical connections. In detail, a size of connection pads of the semiconductor chip and intervals between the connection pads of the semiconductor chip are very fine, while sizes of component mounting pads of the main board used in the electronic device and intervals between the component mounting pads of the main board are significantly larger than those of the semiconductor chip. Therefore, it may be difficult to directly mount the semiconductor chip on the main board, and packaging technology for buffering a difference in circuit widths between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

FIGS. 3A and 3B are schematic cross-sectional views illustrating states of a fan-in semiconductor package before and after being packaged.

Figure 4:
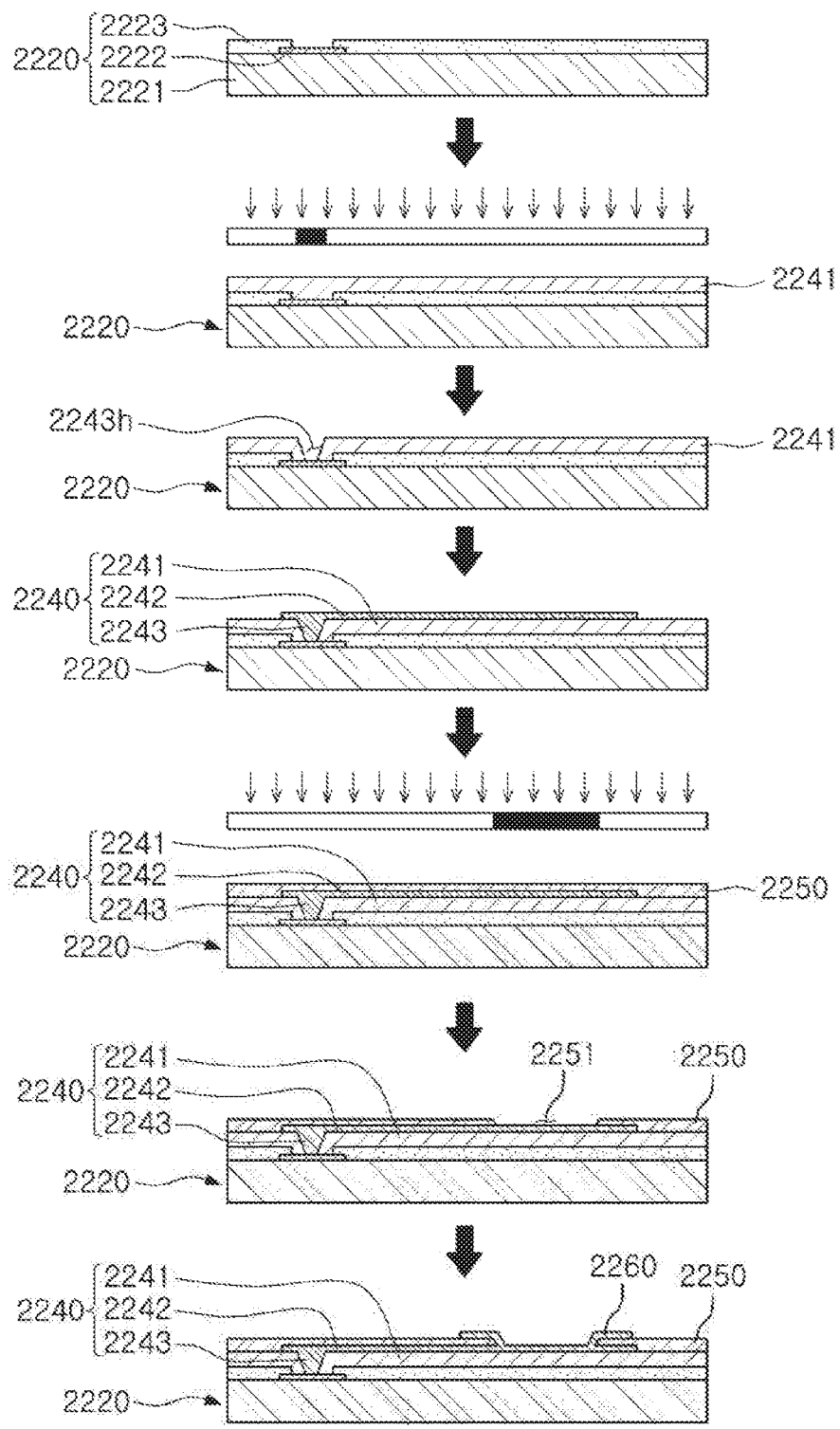
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, an interconnection member 2240 may be formed on the semiconductor chip 2220 depending on a size thereof in order to redistribute the connection pads 2222. The interconnection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the interconnection member 2240 may be formed, an opening 2251 may be formed, and an under-bump metal layer 2260, or the like, may be formed. That is, a fan-in semiconductor package 2200 including, for example, the semiconductor chip 2220, the interconnection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in fan-in semiconductor package form. In detail, many elements mounted in smartphones have been developed to allow rapid signal transfer to be implemented while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. Here, even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
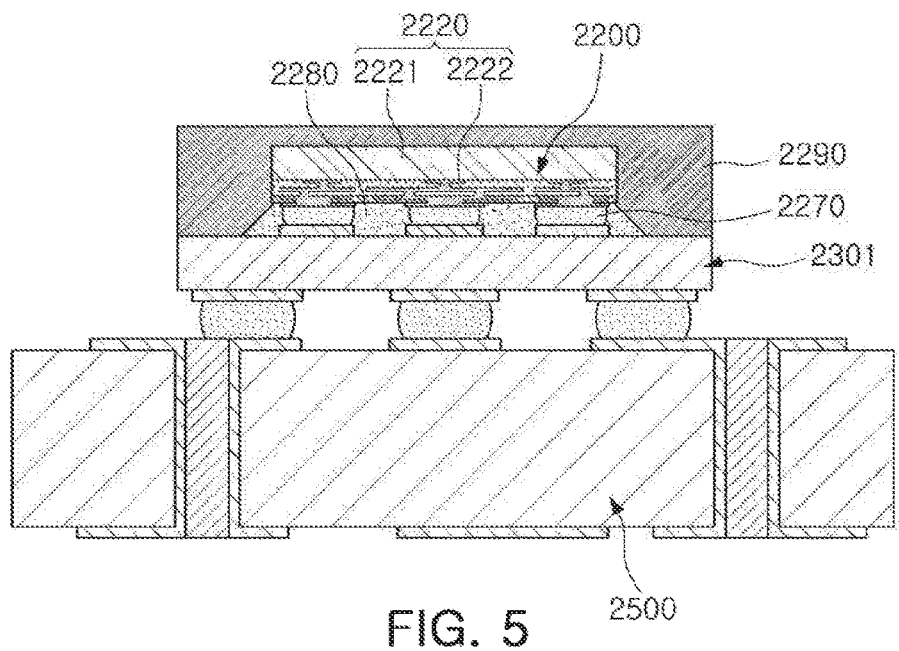
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
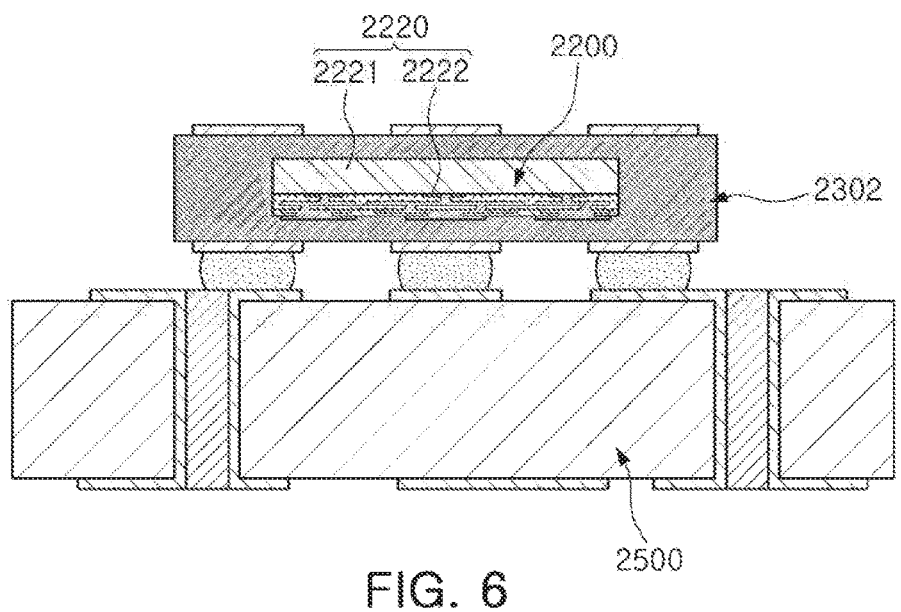
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in a state of being mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
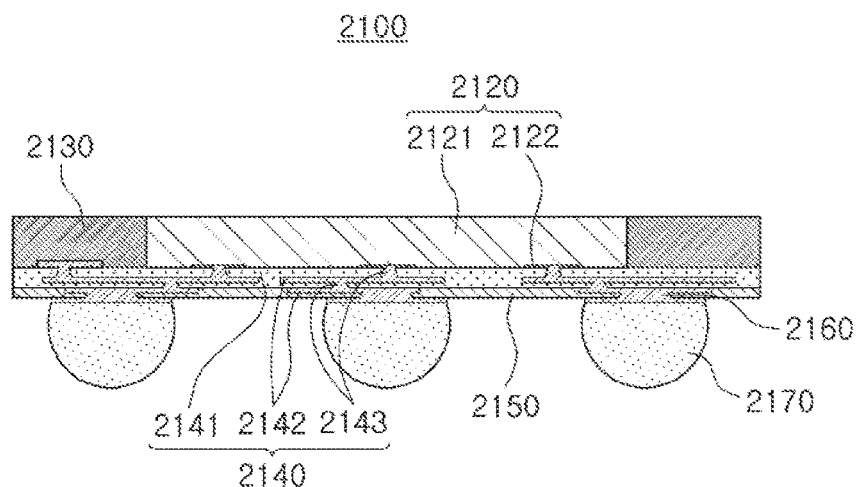
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by an interconnection member 2140. In this case, a passivation layer 2150 may further be formed on the interconnection member 2140, and an under-bump metal layer 2160 may further be formed in openings of the passivation layer 2150. Solder balls 2170 may further be formed on the under-bump metal layer 2160. The semiconductor chip 2120 may be an integrated circuit (IC) including a body 2121, the connection pads 2122, a passivation layer (not illustrated), and the like. The interconnection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the interconnection member formed on the semiconductor chip. As described above, in the fan-in semiconductor package, all I/O terminals of the semiconductor chip need to be disposed inside the semiconductor chip. Therefore, when a size of the semiconductor chip is reduced, a size and a pitch of balls need to be reduced, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the interconnection member formed on the semiconductor chip as described above. Therefore, even in the case that a size of the semiconductor chip is reduced; a standardized ball layout may be used in the fan-out semiconductor package as is, such that the fan-out semiconductor package may be mounted on the main board of the electronic device without using a separate interposer substrate, as described below.

Figure 8:
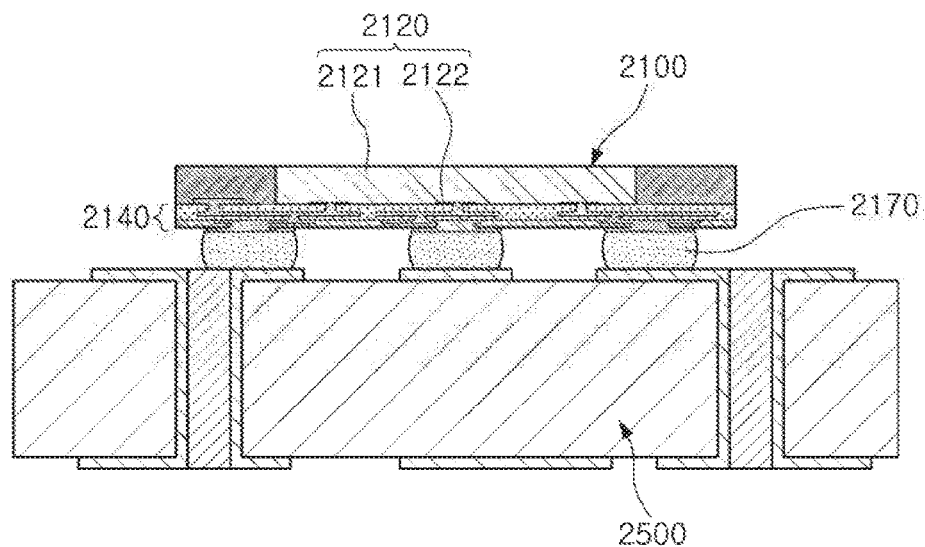
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the interconnection member 2140 formed on the semiconductor chip 2120 and capable of redistributing the connection pads 2122 to a fan-out region outside of an area of the semiconductor chip 2120, such that the standardized ball layout may be used in the fan-out semiconductor package 2100 as is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented to have a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type semiconductor package using a printed circuit board (PCB), and may solve a problem occurring due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is conceptually different from a printed circuit board (PCB) such as an interposer substrate, or the like, having a scale, a purpose, and the like, different from those of the fan-out semiconductor package, and having the fan-in semiconductor package embedded therein.

A fan-out semiconductor package of which structural stability is improved will hereinafter be described with reference to the drawings.

Figure 9:
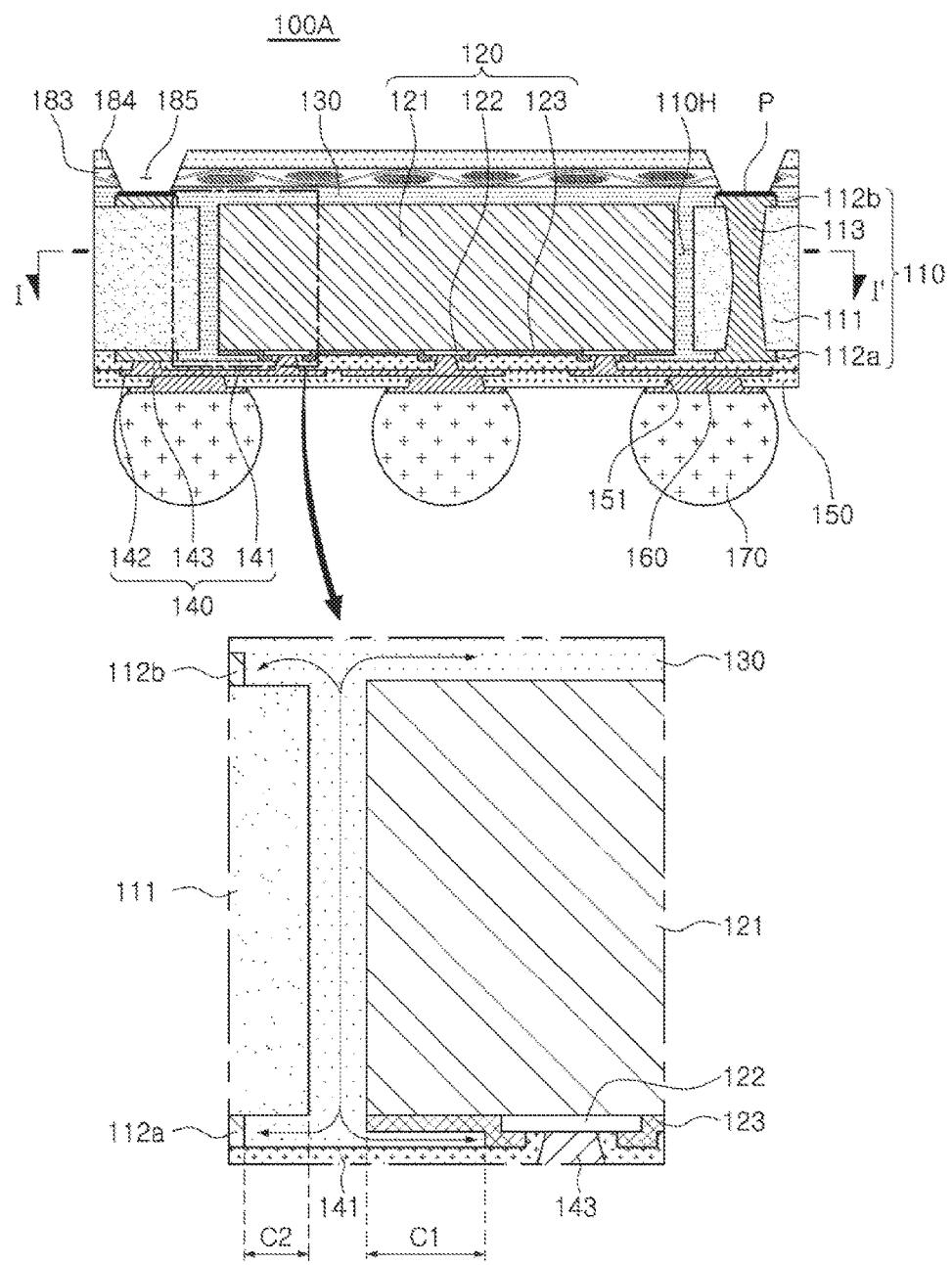
FIG. 9 is a schematic cross-sectional view illustrating an example of a fan-out semiconductor package.

FIG. 9 is a schematic cross-sectional view illustrating an example of a fan-out semiconductor package.

Figure 10:
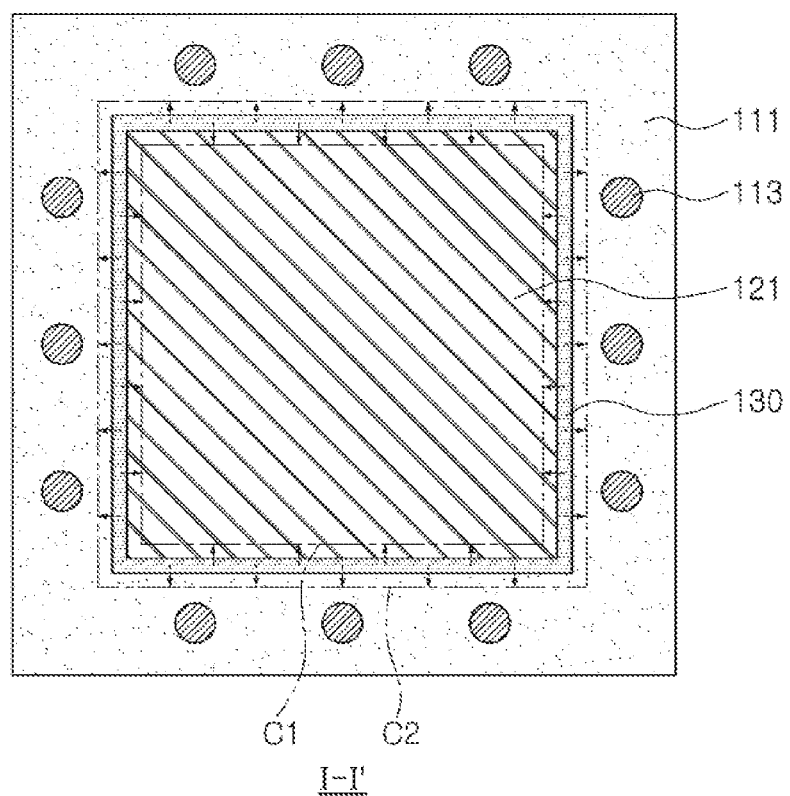
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to the drawings, a fan-out semiconductor package 100A according to an exemplary embodiment in the present disclosure may include a first interconnection member 110 having a through-hole 110H, a semiconductor chip 120 disposed in the through-hole 110H of the first interconnection member 110 and having an active surface having connection pads 122 disposed thereon and an inactive surface opposing the active surface, an encapsulant 130 encapsulating at least portions of the first interconnection member 110 and the inactive surface of the semiconductor chip 120, a second interconnection member 140 disposed on the first interconnection member 110 and the active surface of the semiconductor chip 120, a passivation layer 150 disposed on the second interconnection member 140, an under-bump metal layer 160 formed in openings 151 of the passivation layer 150, connection terminals 170 formed on the under-bump metal layer 160, a reinforcing layer 183 disposed on the encapsulant 130, a resin layer 184 disposed on the reinforcing layer 183, and openings 185 penetrating through the resin layer 184, the reinforcing layer 183, and the encapsulant 130, and exposing at least portions of a redistribution layer 112b of the first interconnection member 110.

Meanwhile, the encapsulant 130 may fill spaces between walls of the through-hole 110H and side surfaces of the semiconductor chip 120, and at least portions of the encapsulant 130 may extend to a space between the first interconnection member 110 and the second interconnection member 140 and a space between the active surface of the semiconductor chip 120 and the second interconnection member 140. That is, the encapsulant 130 may be disposed in an approximately I shape in a cross-sectional view between the first interconnection member 110 and the semiconductor chip 120. Therefore, the encapsulant 130 may fix edge portions of upper and lower surfaces of the first interconnection member 110 of which reliability is bad and edge portions of the active surface and the inactive surface of the semiconductor chip 120 of which reliability is bad to thus alleviate thermal or mechanical stress due to mismatch between coefficients of thermal expansion (CTEs) and promote structural stability.

Meanwhile, in the space between the active surface of the semiconductor chip 120 and the second interconnection member 140, the encapsulant 130 may extend up to only an edge portion C1 of the active surface of the semiconductor 120. A central portion of the active surface of the semiconductor chip 120 may be in contact with an insulating layer 141 of the second interconnection member 140. Similarly, in the space between the first interconnection member 110 and the second interconnection member 140, the encapsulant 130 may extend up to only an inner edge portion C2 of the first interconnection member 110. The remaining portions of the first interconnection member 110 may be in contact with the insulating layer 141 of the second interconnection member 140. As described above, the encapsulant 130 may selectively fix only the edge portions of the upper and lower surfaces of the first interconnection member 110 of which the reliability is bad and the edge portions of the active surface and the inactive surface of the semiconductor chip 120 of which the reliability is bad, such that a phenomenon that the encapsulant 130 bleeds into unnecessary portions may be prevented. Resultantly, a phenomenon that the connection pads 122 of the semiconductor chip 120 and a surface of a redistribution layer 112a of the first interconnection member 110 are polluted by the encapsulant 130 may be prevented.

The respective components included in the fan-out semiconductor package 100A according to the exemplary embodiment will hereinafter be described in more detail.

The first interconnection member 110 may include the redistribution layers 112a and 112b redistributing the connection pads 122 of the semiconductor chip 120 to thus reduce the number of layers of the second interconnection member 140. If necessary, the first interconnection member 110 may maintain rigidity of the fan-out semiconductor package 100A depending on materials, and serve to secure uniformity of a thickness of the encapsulant 130. In some cases, due to the first interconnection member 110, the fan-out semiconductor package 100A according to the exemplary embodiment may be used as a portion of a package-on-package. The first interconnection member 110 may have the through-hole 110H. The through-hole 110H may have the semiconductor chip 120 disposed therein to be spaced apart from the first interconnection member 110 by a predetermined distance. The side surfaces of the semiconductor chip 120 may be surrounded by the first interconnection member 110. However, such a form is only an example and may be variously modified to have other forms, and the fan-out semiconductor package 100A may perform another function depending on such a form.

The first interconnection member 110 may include an insulating layer 111, a first redistribution layer 112a protruding from and disposed on the insulating layer 111 and in contact with the second interconnection member 140, and a second redistribution layer 112b protruding from and disposed on the other surface of the insulating layer 111 opposing one surface of the insulating layer 111 on which the first redistribution layer 112a is disposed. The first interconnection member 110 may include vias 113 penetrating through the insulating layer 111 and electrically connecting the first and second redistribution layers 112a and 112b to each other. The first and second redistribution layers 112a and 112b may be electrically connected to the connection pads 122. Since the first redistribution layer 112a protrudes from and is disposed on the insulating layer 111, a step may be formed between the insulating layer 111 and the insulating 141 of the second interconnection member 140 in an inner edge portion C2 of the first interconnection member 110. Therefore, the encapsulant 130 may permeate between the insulating layer 111 and the insulating 141 of the second interconnection member 140 to fix the inner edge portions C2 as described above. The encapsulant 130 may be in contact with a side surface of the first redistribution layer 112a in the inner edge portion C2 of the first interconnection member 110. However, the encapsulant 130 may not be in contact with the surface of the first redistribution layer 112a.

A material of the insulating layer 111 is not particularly limited. For example, an insulating material may be used as the material of the insulating layer 111. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass cloth (or a glass fabric), or the like, for example, prepreg, Ajinomoto Build up Film (ABF), FR-4, Bismaleimide Triazine (BT), or the like, but is not limited thereto.

The redistribution layers 112a and 112b may serve to redistribute the connection pads 122 of the semiconductor chip 120, and a material of each of the redistribution layers 112a and 112b may be a conductive material such as copper (Cu), aluminum (Al), silver (Ag), tin (Sn), gold (Au), nickel (Ni), lead (Pb), titanium (Ti), or alloys thereof. The redistribution layers 112a and 112b may have various functions, depending on designs of layers corresponding thereto. For example, the redistribution layers 112a and 112b may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 112a and 112b may include a via pad, a connection terminal pad, and the like.

A surface treatment layer P may be further formed on some of patterns of the redistribution layer 112b exposed from the redistribution layers 112a and 112b through openings formed in the encapsulant 130, if necessary. The surface treatment layer P is not particularly limited as long as it is known in the related art, but may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The vias 113 may electrically connect the redistribution layers 112a and 112b formed on different layers to each other, resulting in an electrical path in the first interconnection member 110. A material of each of the vias 113 may be a conductive material. Each of the vias 113 may be entirely filled with a conductive material and may have a sandglass cross-sectional shape, but is not limited thereto. The vias 113 may be formed simultaneously with via pads of the redistribution layers 112a and 112b to thus be integrated with the via pads without having a boundary, but are not limited thereto.

The semiconductor chip 120 may be an integrated circuit (IC) provided in an amount of several hundreds to several millions of elements or more integrated in a single chip. The IC may be, for example, an application processor chip such as a central processor (for example, a CPU), a graphics processor (for example, a GPU), a digital signal processor, a cryptographic processor, a microprocessor, a microcontroller, or the like, but is not limited thereto. The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. The edge portion C1 of the active surface of the semiconductor chip 120 may have a step with respect to the insulating layer 141 of the second interconnection member 140 through the passivation layer 123, and the encapsulant 130 may permeate between the edge portion C1 of the active surface of the semiconductor chip 120 and the insulating 141 of the second interconnection member 140 to thus fix the edge portion C1 as described above. The encapsulant 130 may cover at least portions of the passivation layer 123 in the edge portion C1 of the active surface.

The inactive surface of the semiconductor chip 120 may be disposed on a level below an upper surface of the second redistribution layer 112b of the first interconnection member 110. For example, the inactive surface of the semiconductor chip 120 may be disposed on a level below an upper surface of the insulating layer 111 of the first interconnection member 110. A height difference between the inactive surface of the semiconductor chip 120 and the upper surface of the second redistribution layer 112b of the first interconnection member 110 may be 2 µm or more, for example, 5 µm or more. In this case, generation of cracks in corners of the inactive surface of the semiconductor chip 120 may be effectively prevented. In addition, a deviation of an insulating distance on the inactive surface of the semiconductor chip 120 in a case in which the encapsulant 130 is used may be significantly reduced.

The encapsulant 130 may protect the first interconnection member 110 and/or the semiconductor chip 120. The encapsulant 130 may cover the first interconnection member 110 and the inactive surface of the semiconductor chip 120. In addition, the encapsulant 130 may fill spaces between the walls of the through-hole 110H and the side surfaces of the semiconductor chip 120, and at least portions of the encapsulant 130 may extend to the space between the first interconnection member 110 and the second interconnection member 140 and the space between the active surface of the semiconductor chip 120 and the second interconnection member 140. That is, the encapsulant 130 may be disposed in the approximately I shape in the cross-sectional view between the first interconnection member 110 and the semiconductor chip 120. Therefore, the encapsulant 130 may fix the edge portions of the upper and lower surfaces of the first interconnection member 110 of which the reliability is bad and the edge portions of the active surface and the inactive surface of the semiconductor chip 120 of which the reliability is bad to thus alleviate the thermal or mechanical stress due to the mismatch between the coefficients of thermal expansion (CTEs) and promote structural stability. Meanwhile, the encapsulant 130 may fill the through-hole 110H to thus serve as an adhesive and reduce buckling of the semiconductor chip 120 depending on materials.

The materials of the encapsulant 130 are not particularly limited. For example, an insulating material may be used as the materials of the encapsulant 130. In this case, the insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, or the like. In a case in which the encapsulant 130 includes the inorganic filler, the encapsulant 130 may alleviate (thermal or mechanical) impact of the edge portions of the upper and lower surfaces of the first interconnection member 110 of which the reliability is bad and the edge portions of the active surface and the inactive surface of the semiconductor chip 120 of which the reliability is bad. Alternatively, a material in which a thermosetting resin or a thermoplastic resin is impregnated together with an inorganic filler in a core material such as a glass cloth (or a glass fabric) may also be used as the insulating material.

The second interconnection member 140 may be configured to redistribute the connection pads 122 of the semiconductor chip 120. Several tens to several hundreds of connection pads 122 having various functions may be redistributed by the second interconnection member 140, and may be physically or electrically connected to an external source through connection terminals 170 to be described below depending on the functions. The second interconnection member 140 may include insulating layers 141, the redistribution layers 142 disposed on the insulating layers 141, and vias 143 penetrating through the insulating layers 141 and connecting the redistribution layers 142 to each other. In the fan-out semiconductor package 100A according to the exemplary embodiment, the second interconnection member 140 may include a single layer, but may also include a plurality of layers.

An insulating material may be used as a material of the insulating layers 141. In this case, a photosensitive insulating material such as a photoimagable dielectric (PID) resin may also be used as the insulating material. That is, the insulating layer 141 may be a photosensitive insulating layer. In a case in which the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other or may be different from each other, as necessary. When the insulating layers 141 are the multiple layers, the insulating layers 141 may be integrated with each other depending on a process, such that a boundary therebetween may also not be apparent.

The redistribution layers 142 may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 142 may include a via pad, a connection terminal pad, and the like.

A surface treatment layer (not illustrated) may be formed on the exposed redistribution layer 142, if necessary. The surface treatment layer (not illustrated) is not particularly limited as long as it is known in the related art, but may be formed by, for example, electrolytic gold plating, electroless gold plating, OSP or electroless tin plating, electroless silver plating, electroless nickel plating/substituted gold plating, DIG plating, HASL, or the like.

The vias 143 may electrically connect the redistribution layers 142, the connection pads 122, or the like, formed on different layers to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be entirely filled with the conductive material, or the conductive material may also be formed along a wall of each of the vias. In addition, each of the vias 143 may have all shapes known in the related art, such as a tapered shape, a cylindrical shape, and the like.

Thicknesses of the redistribution layers 112a and 112b of the first interconnection member 110 may be greater than those of the redistribution layers 142 of the second interconnection member 140. Since the first interconnection member 110 may have a thickness equal to or greater than that of the semiconductor chip 120, the redistribution layers 112a and 112b formed in the first interconnection member 110 may be formed to be large depending on a scale of the first interconnection member 110. On the other hand, the redistribution layers 142 of the second interconnection member 140 may be formed at sizes relatively smaller than those of the redistribution layers 112a and 112b of the first interconnection member 110 for thinness of the second interconnection member 140.

The passivation layer 150 may be additionally configured to protect the second interconnection member 140 from external physical or chemical damage. The passivation layer 150 may have the openings 151 exposing at least portions of the redistribution layer 142 of the second interconnection member 140. The number of openings 151 formed in the passivation layer 150 may be several tens to several thousands.

A material having an elastic modulus greater than that of the insulating layer 141 of the second interconnection member 140 may be used as a material of the passivation layer 150. For example, ABF that does not include a glass cloth (or a glass fabric), but includes an inorganic filler and an insulating resin, or the like, may be used as the material of the passivation layer 150. When the ABF, or the like, is used as the material of the passivation layer 150, a weight percent of the inorganic filler included in the passivation layer 150 may be greater than that of the inorganic filler included in the insulating layer 141 of the second interconnection member 140. In this condition, reliability may be improved. When the ABF, or the like, is used as the material of the passivation layer 150, the passivation layer 150 may be a non-photosensitive insulating layer including the inorganic filler, and may be effective in improving reliability, but is not limited thereto.

The under-bump metal layer 160 may be additionally configured to improve connection reliability of the connection terminals 170 and improve board level reliability of the fan-out semiconductor package 100A. The under-bump metal layer 160 may be connected to the redistribution layer 142 of the second interconnection member 140 exposed through the openings 151 of the passivation layer 150. The under-bump metal layer 160 may be formed in the openings 151 of the passivation layer 150 by the known metallization method using the known conductive metal such as a metal, but is not limited thereto.

The connection terminals 170 may be additionally configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto.

The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122 of the semiconductor chip 120, but are not limited thereto, and may also be provided in an amount of several tens to several thousands or more or several tens to several thousands or less. When the connection terminals 170 are solder balls, the connection terminals 170 may cover side surfaces of the under-bump metal layer 160 extending onto one surface of the passivation layer 150, and connection reliability may be more excellent.

At least one of the connection terminals 170 may be disposed in a fan-out region. The fan-out region is a region except for the region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a reduced thickness, and may have price competitiveness.

The reinforcing layer 183 may be additionally configured to suppress warpage generated in the fan-out semiconductor package 100A. For example, the reinforcing layer 183 may suppress hardening contraction of the material of the encapsulant 130, such as the thermosetting resin film, to suppress warpage of the fan-out semiconductor package 100A. The reinforcing layer 183 may have an elastic modulus relatively greater than that of the encapsulant 130, and may have a coefficient of thermal expansion (CTE) smaller than that of the encapsulant 130. In this case, a warpage suppression effect may be particularly excellent.

The reinforcing layer 183 may include a core material, an inorganic filler, and an insulating resin. For example, the reinforcing layer 183 may be formed of an unclad copper clad laminate (CCL), prepreg, or the like. In a case in which the reinforcing layer 183 includes the core material such as a glass cloth (or a glass fabric), the reinforce layer 183 may be implemented to have a relatively large elastic modulus, and in a case in which the reinforcing layer 183 includes the inorganic filler, the reinforce layer 183 may be implemented to have a relatively small CTE by adjusting a content of the inorganic filler. The reinforcing layer 183 may be attached in a hardened state (a c-stage) to the encapsulant 130. In this case, a boundary surface between the encapsulant 130 and the reinforcing layer 183 may have an approximately linear shape. Meanwhile, the inorganic filler may be silica, alumina, or the like, and the resin may be an epoxy resin, or the like. However, the inorganic filler and the resin are not limited thereto.

The resin layer 184 may be additionally configured to be disposed on the reinforcing layer 183. The resin layer 184 may be formed of a material that is the same as or similar to that of the encapsulant 130, for example, an insulating material that includes an inorganic filler and an insulating resin, but does not include a core material, that is, ABF, or the like. In a case in which the reinforcing layer 183 includes the core material, or the like, it is difficult to form the openings 185 in the reinforcing layer 183 itself, but in a case in which the resin layer 184 is added, the openings 185 may be easily formed. The openings 185 may penetrate through the encapsulant 130, the reinforcing layer 183, and the resin layer 184, and may expose at least portions of the redistribution layer 112b of the first interconnection member 110. The openings 185 may be utilized as openings for marking. Alternatively, the openings 185 may be utilized as openings for exposing pads in a package-on-package structure. Alternatively, the openings 185 may be utilized as openings for mounting a surface mounted technology (SMT) component. In a case in which the resin layer 184 is disposed, the warpage may be more easily suppressed.

In a case in which the insulating material that includes the inorganic filler and the insulating resin, but does not include the core material, for example, the ABF, or the like, is used as materials of both of the passivation layer 150 and the resin layer 184, that is, in a case in which a material having the same composition is used as materials of both of the passivation layer 150 and the resin layer 184, the fan-out semiconductor package 100A may have a symmetry effect by the passivation layer 150 and the resin layer 184, and the warpage of the fan-out semiconductor package 100A may be more effectively reduced by the symmetry effect.

Although not illustrated in the drawings, a metal layer may be further disposed on an inner wall of the through-hole 110H of the first interconnection member 110, if necessary.

That is, the side surfaces of the semiconductor chip 120 may also be surrounded by the metal layer. Heat generated from the semiconductor chip 120 may be effectively dissipated upwardly or downwardly of the fan-out semiconductor package 100A through the metal layer, and an electromagnetic wave may be effectively blocked through the metal layer. In addition, if necessary, a plurality of semiconductor chips may be disposed in the through-hole 110H of the first interconnection member 110, and the number of through-holes 110H of the first interconnection member 110 may be plural and semiconductor chips may be disposed in the through-holes, respectively. In addition, separate passive components such as a condenser, an inductor, and the like, may be encapsulated together with the semiconductor chip in the through-hole 110H. In addition, a surface mounted component may also be mounted on the passivation layer 150 to be disposed on a level that is substantially the same as that of the connection terminal 170.

Figure 11:
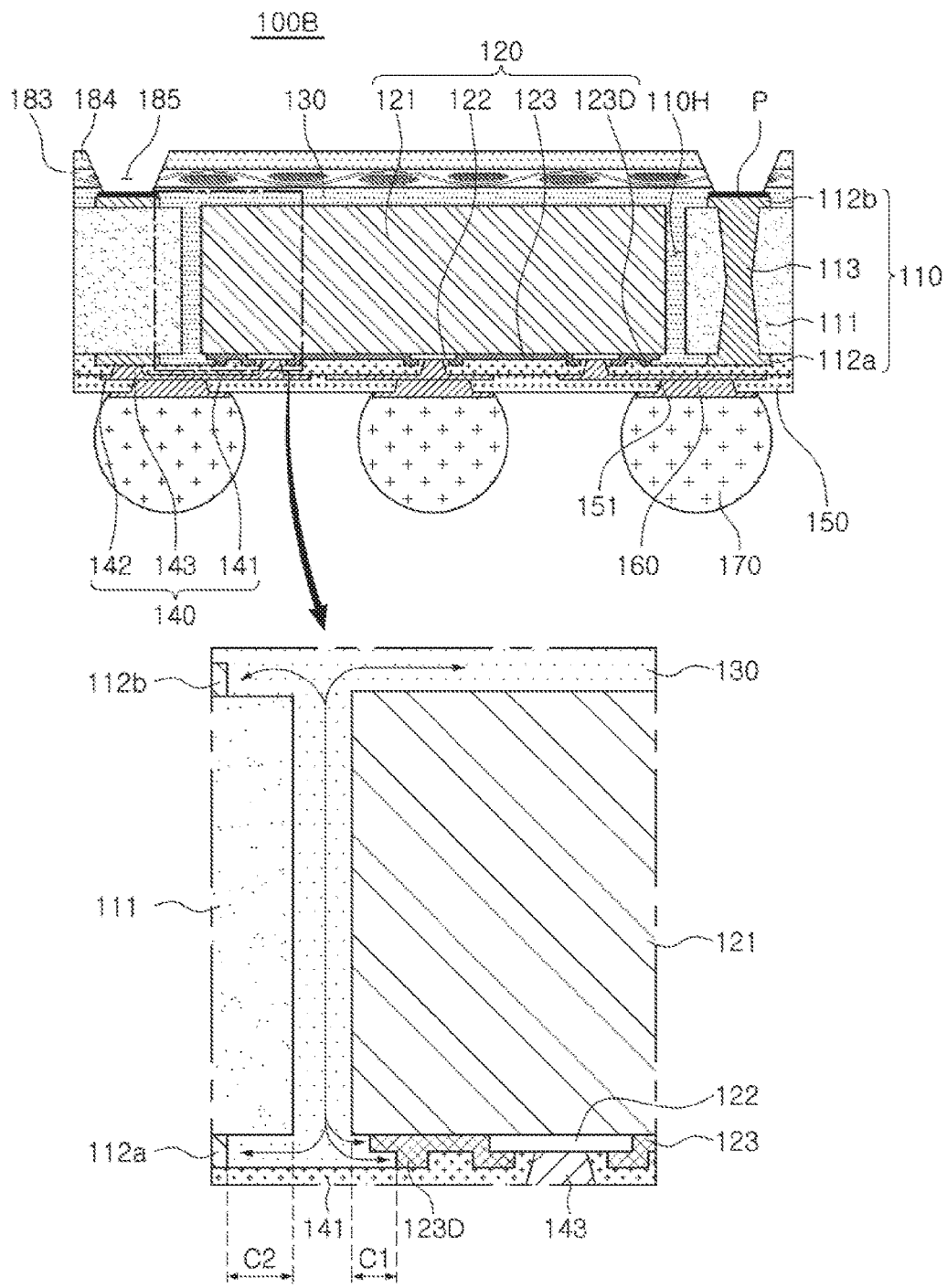
FIG. 11 is a schematic cross-sectional view illustrating another example of a fan-out semiconductor package.

FIG. 11 is a schematic cross-sectional view illustrating another example of a fan-out semiconductor package.

Referring to the drawing, in a fan-out semiconductor package 100B according to another exemplary embodiment in the present disclosure, a dam 123D continuously formed in a passivation layer 123 along an edge, or all edges, of an active surface of a semiconductor chip 120 may be further disposed on the active surface. The active surface of the semiconductor chip 120 and an insulating layer 141 of a second interconnection member 140 may have a step therebetween by the dam 123D, and an encapsulant 130 may permeated between the active surface of the semiconductor chip 120 and the insulating layer 141 of the second interconnection member 140. The encapsulant 130 may be in contact with the dam 123D in an edge portion C1 of the active surface. The encapsulant 130 may permeated up to only the edge portion C1 of the active surface by the dam 123D, and excessive bleeding of the encapsulant 130 may be prevented by the dam 123D. Meanwhile, the passivation layer 123 may be spaced apart from an outermost edge of the active surface of the semiconductor chip 120. In this case, the encapsulant 130 may permeate into a space in which the passivation layer 123 is spaced apart from the outermost edge of the active surface of the semiconductor chip 120, such that a fixing effect may be more excellent. Other contents overlap those described above, and a detailed description thereof is thus omitted.

Figure 12:
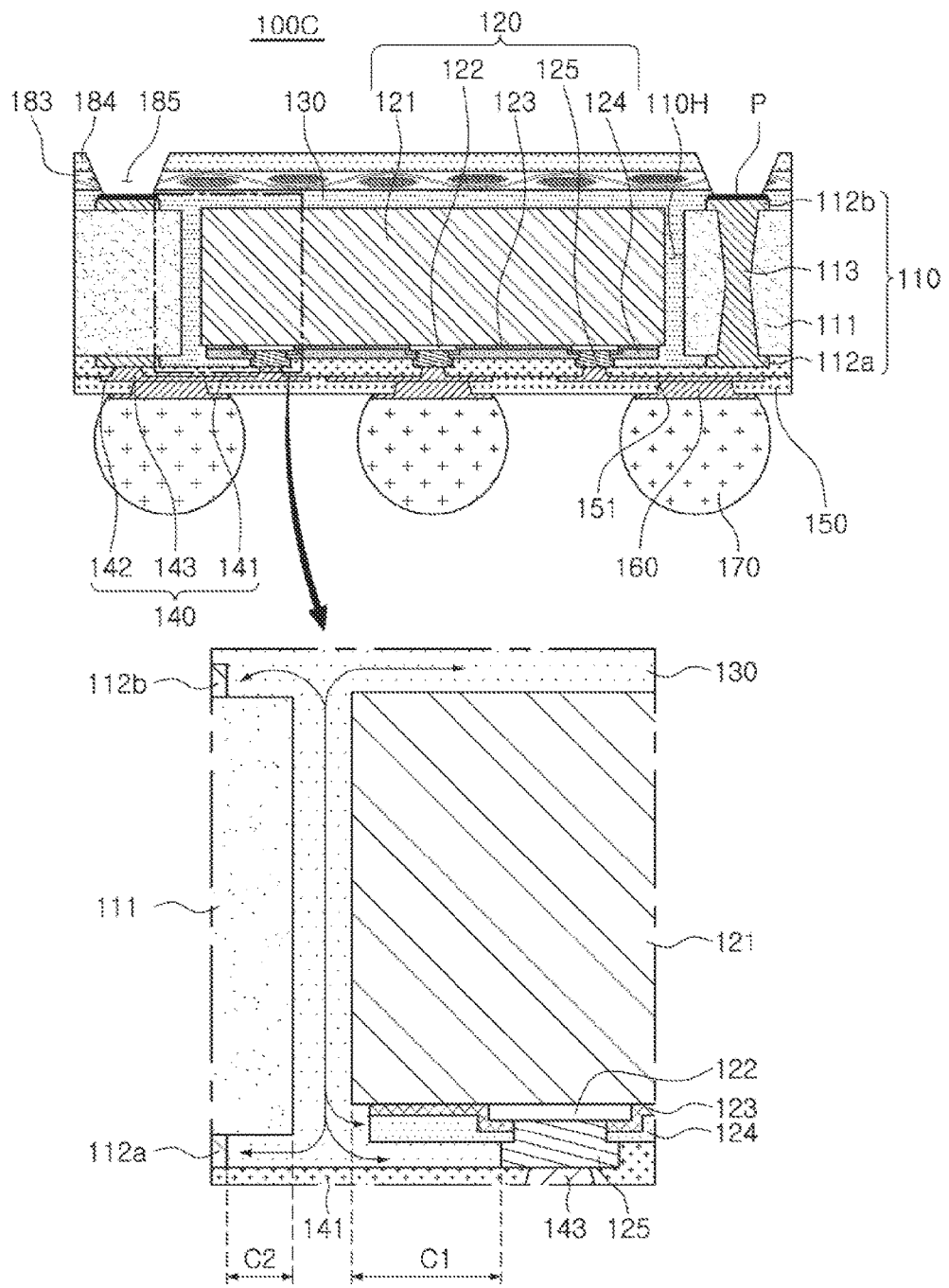
FIG. 12 is a schematic cross-sectional view illustrating another example of a fan-out semiconductor package.

FIG. 12 is a schematic cross-sectional view illustrating another example of a fan-out semiconductor package.

Referring to the drawing, in a fan-out semiconductor package 100C according to another exemplary embodiment in the present disclosure, protrusion bumps 125 formed on exposed connection pads 122 and extending onto passivation layers 123 and 124 may be further disposed on an active surface of a semiconductor chip 120. The active surface of the semiconductor chip 120 and an insulating layer 141 of a second interconnection member 140 may have a step therebetween by the protrusion bumps 125, and an encapsulant 130 may permeated between the active surface of the semiconductor chip 120 and the insulating layer 141 of the second interconnection member 140. The encapsulant 130 may be in contact with the protrusion bumps 125 in an edge portion C1 of the active surface. The encapsulant 130 may permeate up to only the edge portion C1 of the active surface by the protrusion bumps 125, and excessive bleeding of the encapsulant 130 may be prevented by the protrusion bumps 125. Meanwhile, the passivation layers 123 and 124 may be spaced apart from an outermost edge of the active surface of the semiconductor chip 120. In this case, the encapsulant 130 may permeate into a space in which the passivation layers 123 and 124 are spaced apart from the outermost edge of the active surface of the semiconductor chip 120, such that a fixing effect may be more excellent. Meanwhile, the passivation layers 123 and 124 may include a first passivation layer 123 including an oxide film, a nitride film, or the like, and a second passivation layer 124 including a photosensitive polymer material such as PSPI, or the like. Other contents overlap those described above, and a detailed description thereof is thus omitted.

As set forth above, according to the exemplary embodiment in the present disclosure, a fan-out semiconductor package of which structural stability is improved may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a first interconnection member having a through-hole;
a semiconductor chip disposed in the through-hole of the first interconnection member and having an active surface having connection pads disposed thereon and an inactive surface opposing the active surface;
an encapsulant encapsulating at least portions of the first interconnection member and the inactive surface of the semiconductor chip; and
a second interconnection member, on which the first interconnection member and the active surface of the semiconductor chip are disposed, including redistribution layers electrically connected to the connection pads of the semiconductor chip,
wherein the first interconnection member includes redistribution layers electrically connected to the connection pads of the semiconductor chip through at least the redistribution layers of the second interconnection member, and
the encapsulant fills spaces between walls of the through-hole and side surfaces of the semiconductor chip, and at least portions of the encapsulant extend to a space between the first interconnection member and the second interconnection member and a space between the active surface of the semiconductor chip and the second interconnection member.

2. The fan-out semiconductor package of claim 1, wherein in the space between the active surface of the semiconductor chip and the second interconnection member, the encapsulant only extends to an edge portion of the active surface of the semiconductor chip.

3. The fan-out semiconductor package of claim 2, wherein a central portion of the active surface of the semiconductor chip is in contact with an insulating layer of the second interconnection member.

4. The fan-out semiconductor package of claim 1, wherein the semiconductor chip comprises a passivation layer covering the connection pads and the active surface of the semiconductor chip and exposing at least portions of the connection pads, and
the encapsulant covers at least portions of the passivation layer in an edge portion of the active surface.

5. The fan-out semiconductor package of claim 4, wherein the passivation layer includes a dam continuously extending along an edge of the active surface of the semiconductor chip, and the encapsulant is in contact with the dam in the edge portion of the active surface.

6. The fan-out semiconductor package of claim 4, wherein protrusion bumps formed on the exposed connection pads and extending onto the passivation layer are further disposed on the active surface of the semiconductor chip, the encapsulant is in contact with the protrusion bumps in the edge portion of the active surface.

7. The fan-out semiconductor package of claim 1, wherein in the space between the first interconnection member and the second interconnection member, the encapsulant only extends to an inner edge portion of the first interconnection member.

8. The fan-out semiconductor package of claim 7, wherein remaining portions of the first interconnection member other than the inner edge portion of the first interconnection member are in contact with the second interconnection member.

9. The fan-out semiconductor package of claim 1, wherein the first interconnection member further includes an insulating layer, the redistribution layers of the first interconnection member includes a first redistribution layer protruding from and disposed on the insulating layer and in contact with the second interconnection member, and a second redistribution layer protruding from and disposed on the other surface of the insulating layer opposing one surface of the insulating layer on which the first redistribution layer is disposed, and the encapsulant is in contact with a side surface of the first redistribution layer.

10. The fan-out semiconductor package of claim 1, wherein the encapsulant includes an inorganic filler and an insulating resin.

11. The fan-out semiconductor package of claim 10, further comprising a reinforcing layer disposed on the encapsulant, wherein the reinforcing layer has an elastic modulus greater than that of the encapsulant.

12. The fan-out semiconductor package of claim 11, wherein the reinforcing layer includes a core material, an inorganic filler, and an insulating resin.

13. The fan-out semiconductor package of claim 12, further comprising a resin layer disposed on the reinforcing layer, wherein the resin layer includes an inorganic filler and an insulating resin.

14. The fan-out semiconductor package of claim 13, further comprising openings penetrating through the resin layer, the reinforcing layer, and the encapsulant, and exposing at least portions of one of the redistribution layers of the first interconnection member.

15. The fan-out semiconductor package of claim 13, further comprising a passivation layer disposed on the second interconnection member, wherein the passivation layer includes an inorganic filler and an insulating resin.

16. The fan-out semiconductor package of claim 15, wherein a composition of the resin layer and a composition of the passivation layer are the same as each other.

* * * * *